(12) United States Patent
Kouno et al.

(10) Patent No.: US 6,437,858 B1
(45) Date of Patent: Aug. 20, 2002

(54) ABERRATION MEASURING METHOD, ABERRATION MEASURING SYSTEM AND ABERRATION MEASURING MASK

(75) Inventors: Takuya Kouno, Yokkaichi; Hiroshi Nomura, Kawasaki; Tatsuhiko Higashiki, Fujisawa, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 27 days.

(21) Appl. No.: 09/667,818

(22) Filed: Sep. 22, 2000

(30) Foreign Application Priority Data

Sep. 24, 1999 (JP) .............................. 11-271260

(51) Int. Cl.[7] .................................. G01B 9/00
(52) U.S. Cl. ..................... 356/124; 355/53; 355/77; 430/5; 430/30
(58) Field of Search ............... 356/124, 125, 356/126, 127, 399, 400, 401; 355/53, 36, 67, 77, 50, 55; 430/5, 20, 22, 30, 296; 341/3, 7, 10, 13

(56) References Cited

U.S. PATENT DOCUMENTS

| 5,436,097 | A | | 7/1995 | Norishima et al. |
| 6,011,611 | A | | 1/2000 | Nomura et al. |
| 6,130,747 | A | | 10/2000 | Nomura et al. |
| 6,163,376 | A | * | 12/2000 | Nomura et al. ............. 356/401 |

OTHER PUBLICATIONS

Kirk, "Astigmatism and field curvature from pin–bars," Optical/Laser Microlithography IV, Proceedings SPIE–The International Society for Optical Engineering (3/6–8/91), 1463:282–291.

* cited by examiner

Primary Examiner—Hoa Q. Pham
(74) Attorney, Agent, or Firm—Finnegan, Henderson, Farabow, Garrett, & Dunner,.L.L.P.

(57) ABSTRACT

A plurality of bars-in-bars marks are formed. Each mark has four small patterns and four large patterns arranged in a direction of a straight line and a direction perpendicular thereto. The straight lines of the respective bars-in-bars marks are disposed at angles of 0°, 30° and 60°.

12 Claims, 8 Drawing Sheets

ABERRATION MEASURING METHOD, ABERRATION MEASURING SYSTEM AND ABERRATION MEASURING MASK

CROSS-REFERENCE TO RELATED APPLICATIONS

This application is based upon and claims the benefit of priority from the prior Japanese Patent Application No. 11-271260, filed Sep. 24, 1999, the entire contents of which are incorporated herein by reference.

BACKGROUND OF THE INVENTION

The present invention relates to an aberration measuring method, an aberration measuring system and an aberration measuring mask for measuring a lens aberration in an optical system.

A lens aberration of an exposure apparatus used in a lithography process adversely affects a pattern position error, a focus error, a variation in pattern dimensions on a semiconductor device pattern. The kind of aberration can be determined, depending on whether the effect of the lens aberration relates to the pattern size or the pattern direction.

Conventional methods of evaluating astigmatism or spherical aberration using such phenomena include a Kirk method (Joseph P. Kirk, "Astigmatism and field curvature from pinbars", SPIE Vol. 1463 (1991), P.294), a line-width abnormality value measuring method which evaluates coma aberration, and a relative displacement measuring method (Jpn. Pat. Appln. KOKAI Publication No. 11-142108).

FIGS. 1A to 1D show aberration measuring patterns used in the line-width abnormality value measuring method. In the line-width abnormality value measuring method, five line patterns each with an equal line width, as shown in FIGS. 1A to 1D, are transferred on a wafer, and an error in line width between both endmost lines is measured by a length-measuring type scanning electron microscope (SEM). As is shown in FIGS. 1A to 1D, four five-line patterns having line directions set at 0°, 45°, 90° and 135° with respect to a reference straight line 111 are provided, thereby to measure aberration in each line-width direction.

FIGS. 2A and 2B show aberration measuring patterns used in the relative displacement measuring method. In the relative displacement measuring method, as shown in FIGS. 2A and 2B, two kinds of patterns with different line widths are disposed in parallel, and a relative displacement is measured by using a difference in positional displacement of each pattern width. Based on the amount of the relative displacement, an aberration is measured. The pattern shown in FIG. 2A is used to measure an aberration in 0° and 90° directions with respect to a reference line 121, and the pattern shown in FIG. 2B is used to measure an aberration in 45° and 135° directions with respect to the reference line 121.

With further reduction in pattern size and variation in device structure in modern technology, there arise problems of aberrations other than coma aberration. For instance, in fabrication of DRAMs, capacitors with deep trench structure have been formed. Unlike conventional line & space patterns, etc., the deep-trench type capacitor has a two-dimensional pattern. Specifically, a pattern is disposed in one direction, and another pattern is disposed in another direction. In this case, it is necessary to consider not only the effect of the pattern disposed in one direction, but also the relationship among the patterns disposed in a plurality of directions, in particular, a diffraction. Also in the case of device activation regions, etc. there is the same necessity to consider the relationship among the patterns disposed in a plurality of directions.

Specifically, in the conventional line & space pattern, etc., the sizes of patterns disposed in one direction will vary due to diffraction. This adverse effect has been observed in the prior art. In order to decrease it, a method has been proposed wherein an aberration in a projecting optical system is measured and corrected and thus a normal pattern is formed. With this aberration measurement, adequate pattern precision has been obtained in the conventional patterns.

On the other hand, in the case of the deep-trench capacitor, for instance, diffraction occurs not only between adjacent patterns disposed in one direction but also between adjacent patterns disposed in plural directions. Consequently, transferred patterns become triangular or pentagonal. It is known that this undesirable phenomenon is due to an aberration called "three-fold symmetry aberration" or "five-fold symmetry aberration" occurring in the projecting optical system.

It is known that each term of a Zernike series obtained by series-developing a Zernike function, which is obtained by expressing the lens aberration function by the function of coordinates $(R, \theta)$ at a pupil plane, is represented by a radial function (zernike coefficient ZIxvariable R). For instance, the term representing coma aberration is expressed by $Z_2 R \cos \theta$, $Z_3 R \sin \theta$; the term representing three-fold symmetry aberration is expressed by $Z_{10} R^3 \cos 3\theta$, $Z_{11} R^3 \sin 3\theta$; and the term representing five-fold symmetry aberration is expressed by $Z_{26} R^5 \cos 5\theta$, $Z_{27} R^5 \sin 5\theta$.

There are conventional aberration measurement methods for measuring an aberration between an axial direction, and a direction perpendicular thereto, or between the axial direction and a direction at 45° or 135° thereto. However, there is no methods of measuring other aberrations. In the case of conventionally fabricated patterns, adequate pattern precision and exposure tolerance have been obtained without the need to measure such other aberrations. By contrast, in the case of modern small-sized patterns, adequate pattern precision and exposure tolerance cannot be obtained.

BRIEF SUMMARY OF THE INVENTION

The object of the present invention is to provide an aberration measuring method, an aberration measuring system and an aberration measuring mask capable of measuring an (2n+1)-fold (n=natural number) symmetry aberration.

According to an aspect of the present invention, there is provided an aberration measuring method comprising the steps of providing an aberration mask comprising a plurality of aberration measuring pattern units each having a plurality of elemental patterns arranged in a direction of a given straight line, the aberration measuring pattern units being disposed in a given circumferential direction such that the straight line of each of the aberration measuring pattern units is cyclically shifted relative to a reference line at an angle of $(\pi/2)/(2n+1)$ rad (n=natural number) in a range between 0 rad and $\pi/2$ rad; transferring pattern images of the aberration measuring mask onto a substrate to be processed, using an optical system; and detecting the transferred pattern image, thereby measuring an aberration in the direction of the reference straight line of the optical system.

According to another aspect of the invention, there is provided an aberration measuring system comprising an illumination optical system; an aberration measuring mask disposed on an optical path of light from the illumination optical system and comprising a plurality of aberration measuring pattern units each having a plurality of elemental patterns arranged in a direction of a given straight line, the aberration measuring pattern units being disposed in a given circumferential direction such that the straight line of each of the aberration measuring pattern units is cyclically shifted relative to a reference line at an angle of $(\pi/2)/(2n+1)$ rad (n=natural number) in a range between 0 rad and $\pi/2$ rad; and a projecting optical system for focusing light, which has passed through the aberration measuring mask, onto a substrate to be processed.

According to still another aspect of the invention, there is provided an aberration measuring mask comprising a plurality of aberration measuring pattern units each having a plurality of elemental patterns arranged in a direction of a given straight line, the aberration measuring pattern units being disposed in a given circumferential direction such that the straight line of each of the aberration measuring pattern units is cyclically shifted relative to a reference line at an angle of $(\pi/2)/(2n+1)$ rad (n=natural number) in a range between 0 rad and $\pi/2$ rad. Thereby, third- or more-order aberrations, other than in the axial direction, which could be not be measured in the prior art, can be measured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

(First Embodiment)

Figures 1A, 1B, 1C, 1D:
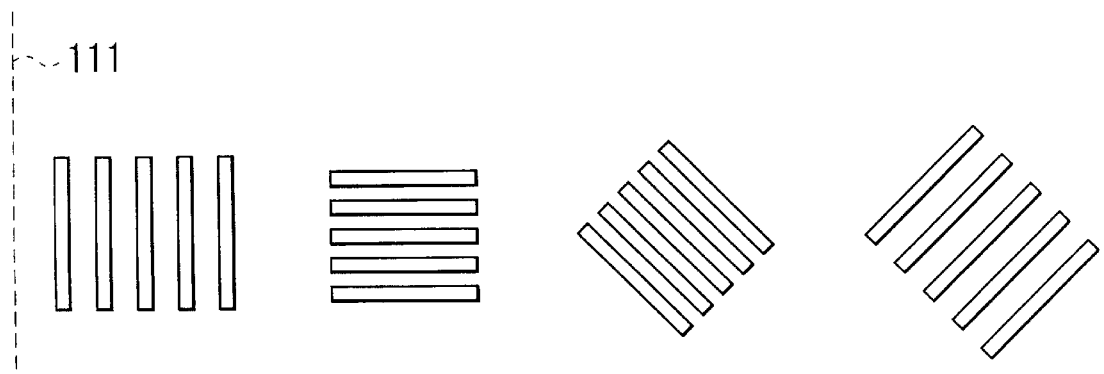
FIGS. 1A to 1D show structures of aberration measuring masks used in a conventional line-width abnormality value measuring method.
Figures 2A, 2B:
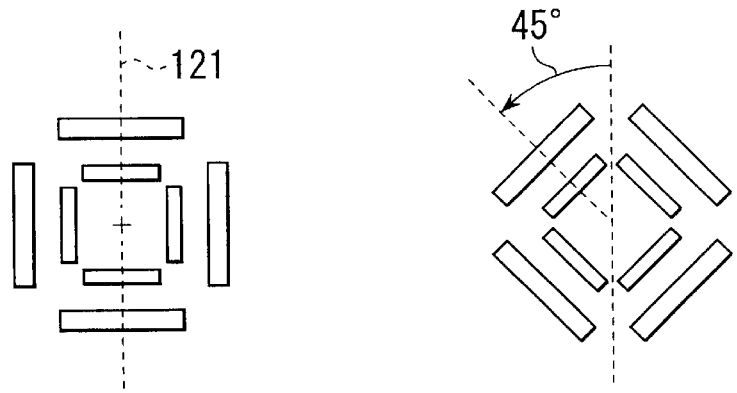
FIGS. 2A and 2B show structures of aberration measuring masks used in a conventional relative displacement measuring method.
Figure 3:
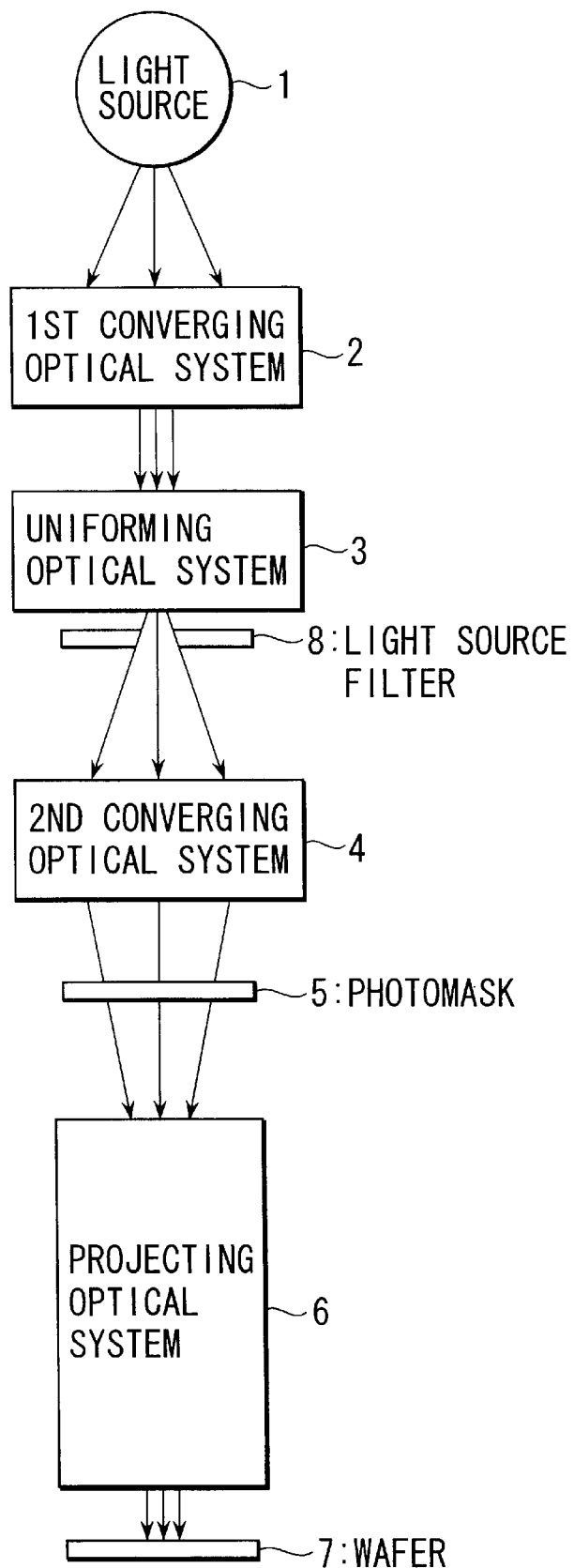
FIG. 3 shows a whole structure of an aberration measuring system according to a first embodiment of the present invention.

FIG. 3 is a diagram showing a whole structure of an aberration measuring system according to a first embodiment of the present invention. In the first embodiment, aberration measurement is performed with a reduction-projecting exposure device.

The aberration measuring system, as shown in FIG. 3, comprises a light source 1, a first converging optical system 2, a uniforming optical system 3, a light source filter 8, a second converging optical system 4, a photomask 5, a projecting optical system 6, and a wafer 7. These structural elements are arranged in the name order along the optical path of exposure light.

The first converging optical system 2 is an element corresponding to an oval reflection mirror and an input lens. The first converging optical system 2 functions to guide a light beam from the light source 1 into the uniforming optical system 3 as efficiently as possible. The first converging optical system 2 comprises, for example, a spherical mirror, a planar mirror and a lens, in addition, to the oval reflection mirror, which are properly disposed. The uniforming optical system 3 is an element corresponding to a fly-eye lens. The uniforming optical system 3 may be composed of an optical fiber bundle or a polyhedral prism.

The second converging optical system 4 is an element corresponding to an output lens and a collimator lens. The second converging optical system 4 combines a plurality of light beams from the uniforming optical system 3, and maintains the telecentric properties of the combined beams at the image surface. The second converging optical system 4 may include a filter and a cold mirror both for passing an aberration-corrected wavelength alone. The filter is inserted at a proper position within the second converging optical system 4, where the light beam is nearly parallel to the optical axis. The cold mirror is inserted at a proper position within the second converging optical system 4.

In the reduction-projecting exposure device with the above structure, when the light source (1) side is viewed from the photomask 5, the incident light has properties (wavelength, coherency, etc.) possessed by light emanating through the second converging optical system 4 from the uniforming optical system 3. In addition, when the light source side is viewed from the photomask 5, an emission-side light intensity distribution of the uniforming optical system 3 is viewed as an apparent light source intensity distribution. Accordingly, in general, in the reduction-projecting exposure device with the above structure, the light source filter 8 disposed on the emission side of the uniforming optical system 3 functions as a secondary light source or an effective source. An effective light source image is focused at a pupil position of the projecting optical system 6.

Figure 4:
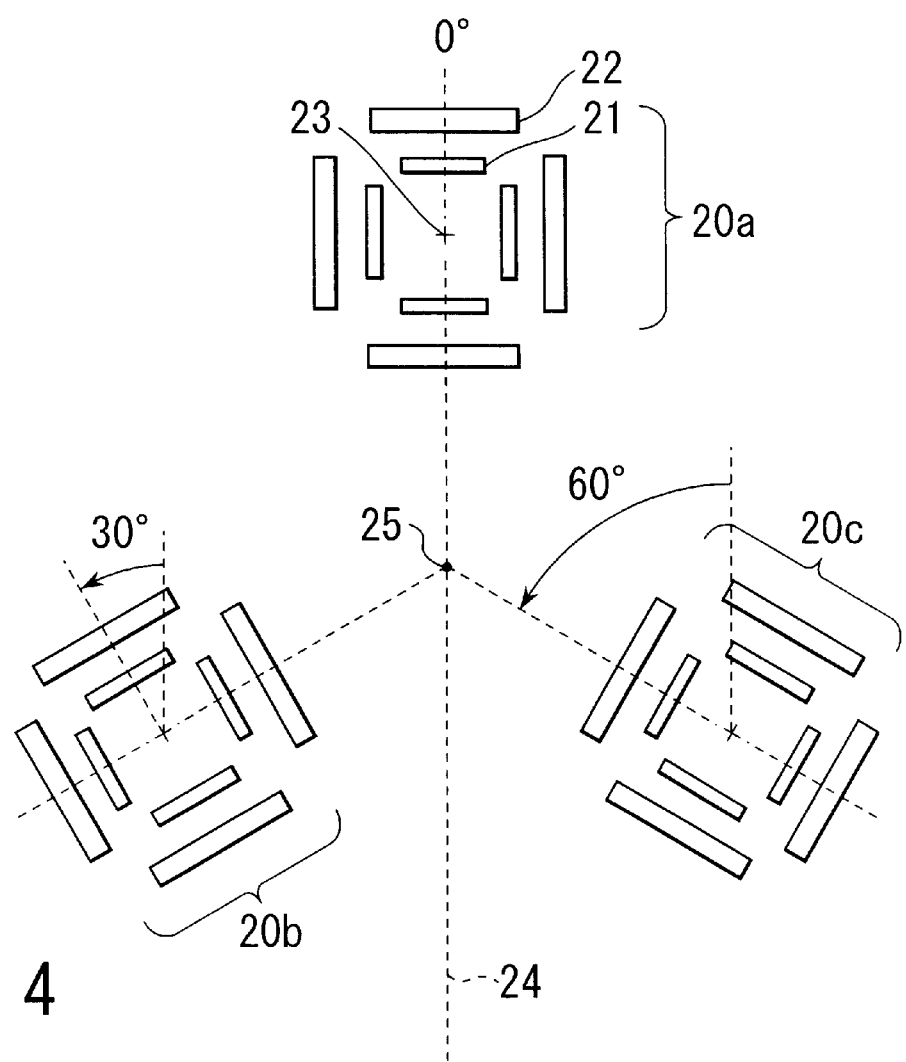
FIG. 4 shows a whole structure of an aberration measuring mask according to the first embodiment.

FIG. 4 shows the structure of the photomask 5 in the above aberration measuring system.

As is shown in FIG. 4, patterns of the photomask 5 are composed of three birds-in-birds marks 20a, 20b and 20c. Each bars-in-bars mark, 20a, 20b, 20c, comprises four small patterns 21 and four large patterns 22.

The four small patterns 21 a re line patterns and arranged in a square with each side 20 μm long. Each pair of opposed small patterns 21 are disposed in parallel. One of the pairs of opposed small patterns 21 is disposed perpendicular to the other pair. The small patterns 21 are point-symmetric with respect to a center point 23.

The four large patterns 22 are also line patterns and arranged in a square with each side 40 μm long. The center of the square is the point 23. Each pair of opposed large patterns 22 are disposed in parallel. The large patterns 22 are point-symmetric with respect to the center point 23. The line width of each large pattern 22 is greater than that of each small pattern 21.

The line length direction of a set of opposed patterns, or the structural elements, of the bars-in-bars mark 20a is set at 0° with respect to a reference line 24. The line length direction of a set of opposed patterns of the bars-in-bars mark 20b is set at 30° with respect to the reference line 24. The line length direction of a set of opposed patterns of the bars-in-bars mark 20c is set at 60° with respect to the reference line 24. The center points 23 of the bars-in-bars marks 20a to 20c are equidistant from an axis 25. Adjacent two of the straight lines connecting the respective center points 23 and the axis 25 form an angle of 120°.

The operation of the aberration measuring system will now be described.

Exposure light emitted from the light source 1, as shown in FIG. 3, enters the first converging optical system 2. The light converged by the first converging optical system 2 is efficiently guided to the uniforming optical system 3. The uniforming optical system 3 uniforms the converged exposure light. The exposure light uniformed by the uniforming optical system 3 is made incident on the second converging optical system 4 via the light source filter 8. The exposure light converged once again by the second converging optical system 4 is emitted on the photomask 5 and an optical image having a desired mask pattern is formed. The optical image is transferred onto the wafer 7 via the projecting optical system 6.

Figure 5:
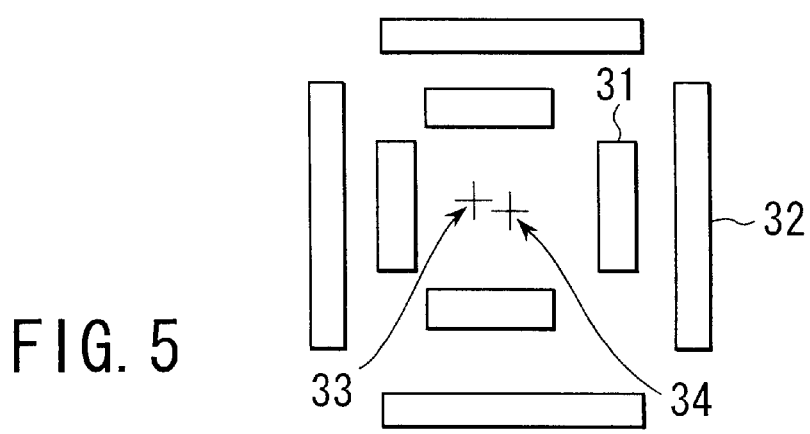
FIG. 5 shows a pattern transferred by the aberration measuring mask according to the first embodiment.

The wafer 7 on which the patterns have been transferred through the above steps is delivered to an ordinary optical misalignment length measuring device, and the pattern lengths are measured by the length measuring device. FIG. 5 is a plan view of the transfer patterns obtained with one of the bars-in-bars marks. As is shown in FIG. 5, the transfer patterns comprise inside patterns 31 and outside patterns 32. The inside patterns 31 are transferred using the small patterns 21, and the outside patterns 32 are transferred using the large patterns 22.

As regards the transfer patterns, a center point 33 of the inside patterns 31 composed of four line patterns and a center point 34 of the outside patterns 32 composed of four line patterns are calculated. A relative positional displacement between both patterns 31 and 32 is measured on the basis of an error between the center points 33 and 34. The measurement of the relative positional displacement is performed for each bars-in-bars mark. The relative positional displacement of each bars-in-bars mark is measured by rotating the stage of the optical misalignment length measuring device for supporting the wafer in units of 120°. Thereby, a three-fold symmetry aberration can be estimated from the relative displacement of the respective bars-in-bars marks. This is possible because in the case of the three-fold symmetry aberration, like coma aberration, the transfer position varies depending on the pattern size.

According to the present embodiment, the mask pattern having bars-in-bars marks disposed at an angle of 30° is transferred and the relative displacement of the respective bars-in-bars is measured. Thereby, the three-fold symmetry aberration can be estimated.

(Second Embodiment)

Figure 6:
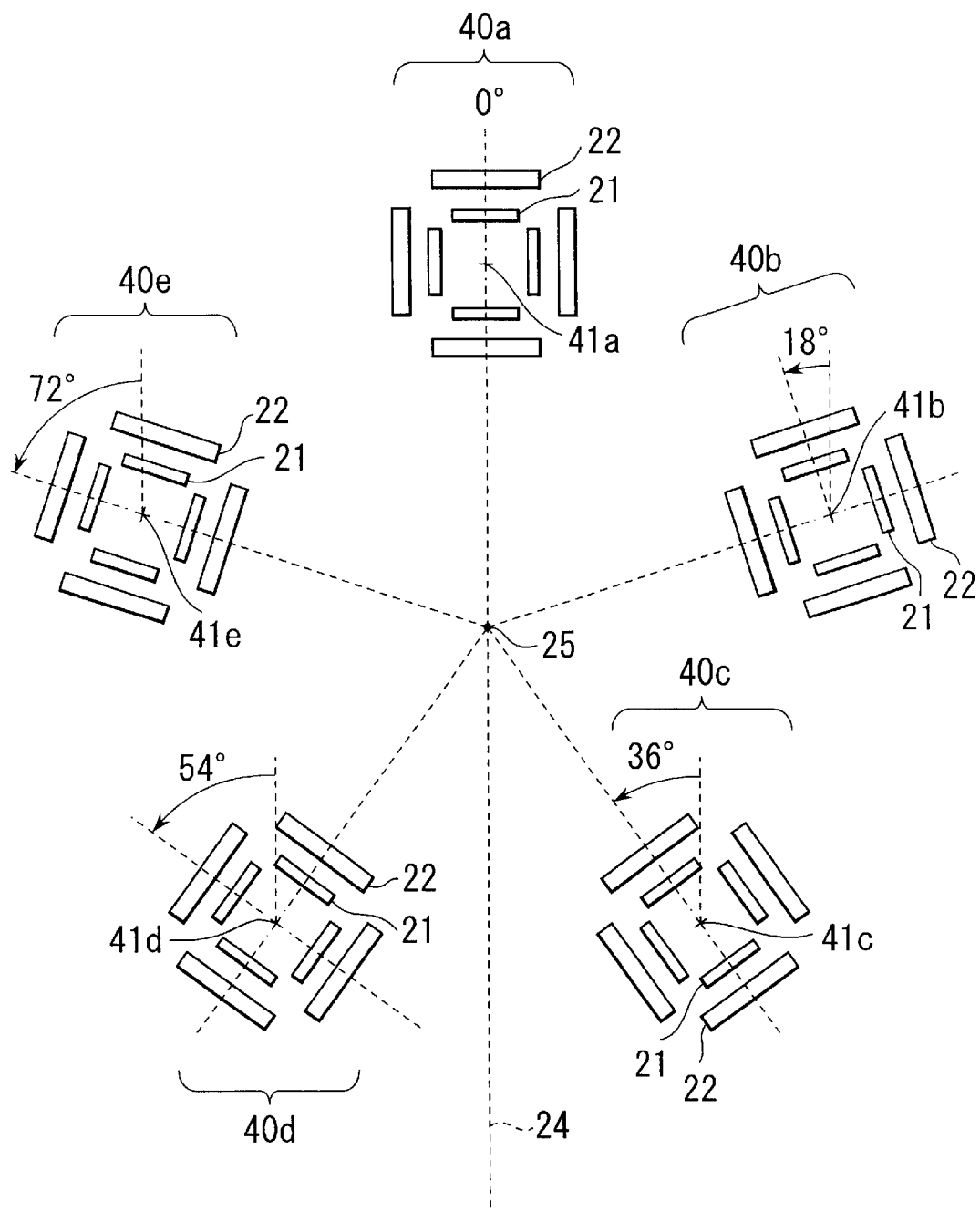
FIG. 6 shows a whole structure of an aberration measuring mask used in aberration measurement according to a second embodiment of the present invention.

FIG. 6 shows a whole structure of an aberration measuring mask used in aberration measurement according to a second embodiment of the present invention. The first embodiment relates to the measurement of the three-fold symmetry aberration, whereas the second embodiment relates to the measurement of a five-fold symmetry aberration. The second embodiment is common to the first embodiment with respect to the structure of the aberration measuring system, except for the structure of the photomask, and so a detailed description of common parts is omitted.

Like the first embodiment, birds-in-birds marks composed of small patterns 21 and large patterns 22 are arranged, as shown in FIG. 6. In the second embodiment, five bars-in-bars marks (40a–40e) are disposed. Each of the five bars-in-bars marks 40a to 40e forms an angle of 18° with another adjacent bars-in-bars mark. Adjacent two of the straight lines connecting the respective center points 41a to 41e of the five bars-in-bars marks 40a to 40e and the axis 25 form an angle of 72°.

The photomask shown in FIG. 6 is built in the reduction-projecting exposure device, and pattern transfer is performed. As regards the transfer patterns, a pattern corresponding to one bars-in-bars mark is the same as is shown in FIG. 5. The relative displacement between the inside pattern 31 and outside pattern 32 of the transfer pattern is measured by the same method as in the first embodiment, using the ordinary optical misalignment length measuring device. In the second embodiment, aberration measurement is performed by rotating the wafer stage of the optical misalignment length measuring device in units of 72°. A five-fold symmetry aberration can be estimated from the measured relative displacement of the respective bars-in-bars marks.

According to the second embodiment, the mask pattern having bars-in-bars marks disposed at an angle of 18° is transferred on the wafer and the relative displacement of the respective bars-in-bars is measured. Thereby, the five-fold symmetry aberration can be estimated.

(Third Embodiment)

Figure 7:
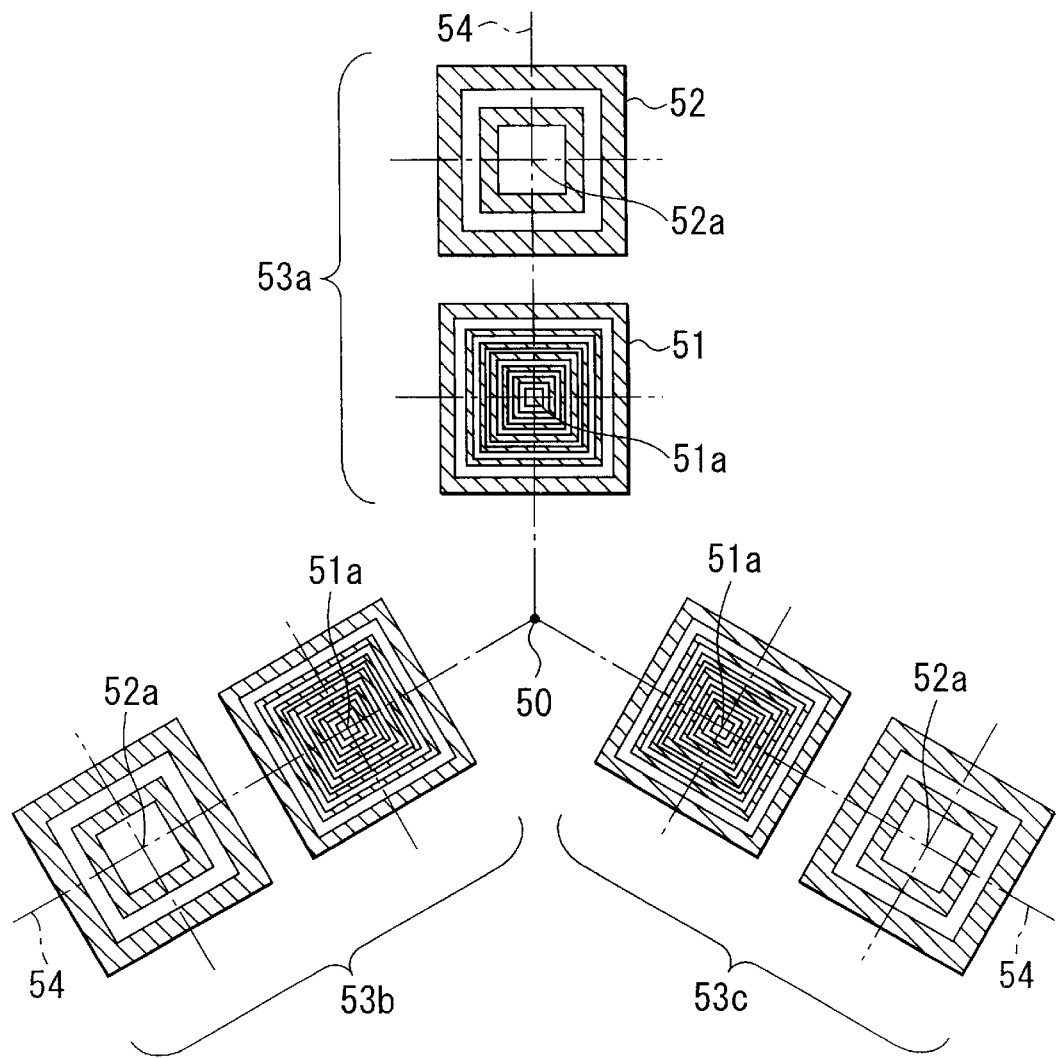
FIG. 7 shows a whole structure of an aberration measuring mask used in aberration measurement according to a third embodiment of the present invention.

FIG. 7 is a plan view showing a whole structure of an aberration measuring mask used in aberration measurement according to a third embodiment of the present invention. An aberration measuring mask in the third embodiment comprises a plurality of pattern units 53a to 53c. Each pattern unit comprises a dense pattern 51 and a non-dense pattern 52. The pattern units 53a to 53c correspond to the bars-in-bars marks in the first and second embodiments. In the first embodiment, the bars-in-bars marks are disposed at an angle of 30°. In the same fashion, in the third embodiment, the pattern units 53a to 53c are disposed at an angle of 30°. More specifically, straight lines 54 connecting center points 51a and 52a of the dense patterns 51 and non-dense patterns 52 pass through the axis 50, and adjacent two of these straight lines form an angle of 120° at the axis 50.

Figure 8:
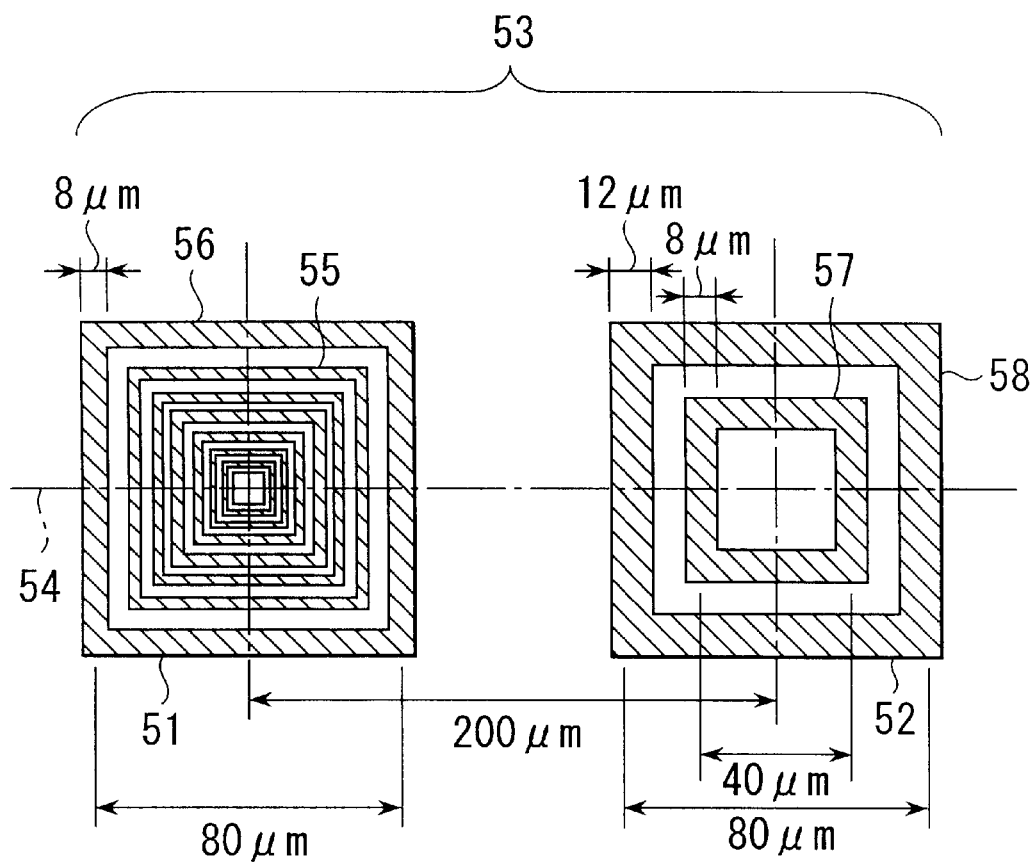
FIG. 8 shows a detailed structure of a pattern unit of the aberration measuring mask according to the third embodiment.

FIG. 8 shows in detail the pattern unit of the aberration measuring mask. The dense pattern 51 is used for a first exposure step, and the non-dense pattern 52 is used for a second exposure step. Both are line-symmetric with respect to the straight line 54.

The dense pattern 51 comprises rectangular annular patterns 55 and a rectangular annular pattern 56. The rectangular annular patterns 55 are a combination of 0.8 μm line & space patterns extending in a direction perpendicular to the line 54 and 0.8 μm line & space patterns extending along the line 54. The rectangular annular pattern 56 is disposed outside the rectangular annular patterns 55 and has each side 80 μm long and a pattern width of 8 μm.

The non-dense pattern 52 comprises a rectangular annular pattern 57 having each side 40 μm long and a pattern width of 8 μm, and a rectangular annular pattern 58 which is disposed outside the rectangular annular patterns 57 and has each side 80 μm long and a pattern width of 12 μm.

The rectangular annular pattern 57 of the non-dense pattern 52 for the second exposure step is formed so as to cover part of the rectangular annular patterns 55 on the transfer substrate. The rectangular annular pattern 58 of the non-dense pattern 52 is formed so as to cover the entirety of the rectangular annular pattern 56. Specifically, the non-dense pattern 52 is formed as a removal pattern for removing a central portion and a peripheral portion of the dense pattern 51.

An aberration measuring method using the above photomask will now be described.

The patterns on the mask, as shown in FIG. 7, are formed using a krypton fluoride excimer laser exposure device having a reduction ratio of 1/4, and an anti-reflection film DUV18 having a thickness of 55 nm is coated. A silicon wafer, on which a positive-type photoresist S210J with a thickness of 0.6 μm is coated, is exposed with an exposure amount of 18 mJ/cm$^2$ (first step).

The photomask is moved in the direction of the line 54 by 200 μm, or the silicon wafer is moved in the direction of the line 54 by 50 μm, so that the transfer pattern of the non-dense pattern 52 may overlap the already formed transfer pattern of the dense pattern 51. In this state, exposure is made with an exposure amount of 17 mJ/cm$^2$ (second step). It is desirable that the transfer patterns overlap such that the center point 51a of the dense pattern 51 coincides with the center point 52a of the non-dense pattern 52. Following the first and second exposure steps, the resist on the substrate is developed using a 0.21-N TMAH developing agent.

Figure 9:
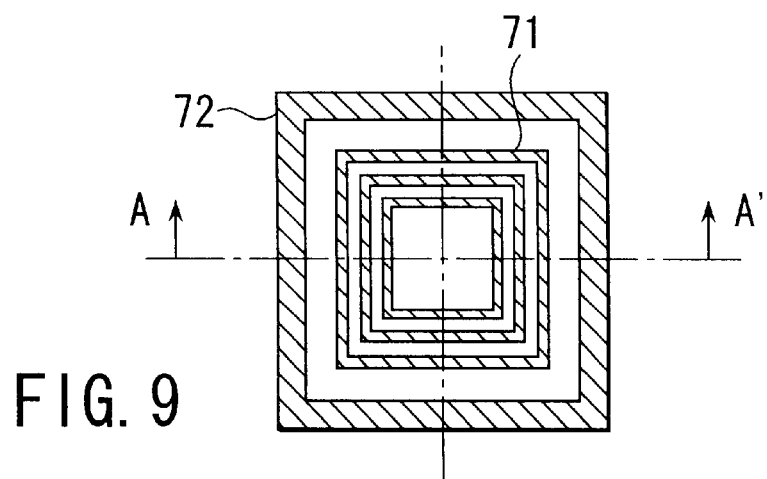
FIG. 9 shows a pattern transferred by the aberration measuring mask according to the third embodiment.

FIG. 9 shows a developed resist pattern. In FIG. 9, attention is paid to a resist pattern transferred using a single pattern unit. An inside pattern 71 obtained by removing part of the rectangular annular pattern 55 and an outside pattern 72 transferred using the rectangular annular pattern 56 are formed.

The resist pattern is obtained for each pattern unit, and the obtained resist patterns are measured by means of the optical misalignment length measuring device.

Figure 10:
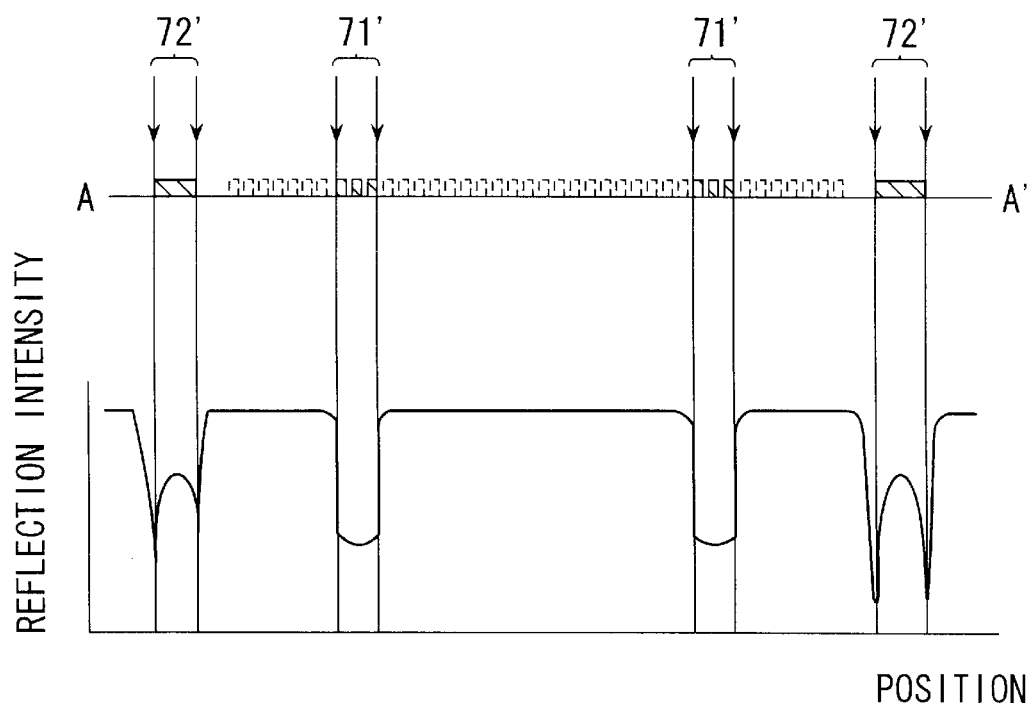
FIG. 10 shows a reflection signal waveform in an A–A' cross section of the transfer pattern shown in FIG. 8 according to the third embodiment.

FIG. 10 shows a reflection intensity waveform obtained by measuring the resist pattern shown in FIG. 9 by means of the optical misalignment length measuring device. Specifically, FIG. 10 shows a waveform obtained in an A–A' cross section in FIG. 9. As is understood from the reflection intensity waveform, edge signals 72' from the outside pattern 72 with the pattern width of 2μm and edge signals 71' from the inside patterns composed of line patterns with the pattern width of 0.2 μm are obtained. A center point of the line-symmetric signals 71' and a center point of the line-symmetric edge signals 72' are obtained, and an error between the center points is measured. Thereby, a relative positional displacement between the inside pattern 71 and outside pattern 72 can be measured.

By measuring the relative positional displacement between the inside pattern 71 and outside pattern 72, a three-fold symmetry aberration can be estimated, like the first embodiment. The effect of the aberration of the projecting lens can be measured in the direction of the line 54 and the direction perpendicular thereto. A five-fold symmetry aberration can also be estimated by using, like the second embodiment, a mask comprising pattern units disposed at angles of 0°, 18°, 36°, 54° and 72° with respect to the reference line.

The third embodiment can bring about the following advantageous effects, which cannot be obtained by the first and second embodiments.

First, even an aberration coefficient which defines the three-fold symmetry aberration or five-fold symmetry aberration can be found. Specifically, the signal profile obtained from the measurement marks as in the present embodiment has a high degree of symmetry of a pair of right and left waveforms. Accordingly, high-precision measurement can be made by curve-fitting the left and left signal waveforms. In fact, not only the three- or five-fold symmetry aberration amount but also the aberration coefficient thereof can be found.

Second, marks can be realized which permit easy detection of the transfer error of the cyclically arranged patterns, only by performing two exposure steps using the dense pattern 51 and non-dense pattern 52. Thereby, pattern measurement can be quickly and exactly performed to inspect lens aberration or asymmetric illumination, without consuming much time in preparing samples for measurement.

Third, even where the size of cyclic patterns is less than the resolution of the measuring device, the position of the pattern within the cyclic patterns can be detected. For example, where the transfer position error of the patterns with a 0.2 μm pitch is to be measured, the size of the patterns is less than the resolution of the ordinary optical system. Thus, it is not possible to measure the position error of a pattern within the cyclic patterns. However, if the measurement marks according to the present embodiment are used, position detection can be made with no problem.

In the present embodiment, the exposure step (first step) using the dense pattern 51 and the exposure step (second step) using the non-dense pattern 52 are performed from the first step. However, needless to say, these steps can be performed from the second step. In addition, the dense pattern 51 and non-dense pattern 52 may be provided on different photomasks. Both the dense pattern 51 and non-dense pattern 52 are formed as rectangular annular patterns. However, the structures of the dense pattern 51 and non-dense pattern 52 are not limited to the embodiment, only if portions necessary for measurement, that is, portions with predetermined regular line widths, are provided. In this embodiment, in each of the dense pattern 51 and non-dense pattern 52, the outside pattern is formed thick and the inside pattern is formed thin. However, needless to say, the outside pattern may be formed thin, and the inside pattern may be formed thick.

(Fourth Embodiment)

Figure 11:
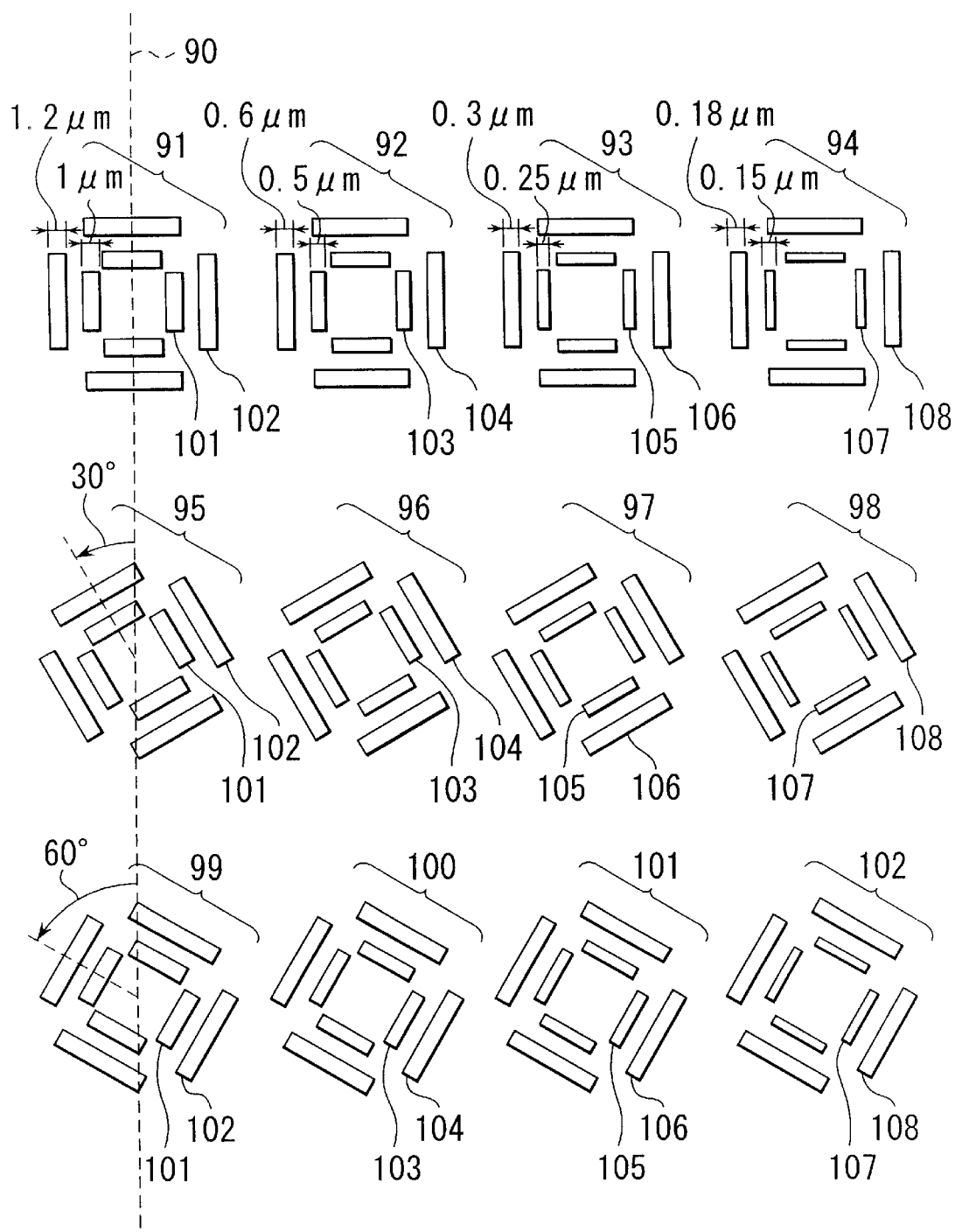
FIG. 11 shows a whole structure of an aberration measuring mask used in aberration measurement according to a fourth embodiment of the present invention.

FIG. 11 shows a whole structure of an aberration measuring mask used in aberration measurement according to a fourth embodiment of the present invention. The fourth embodiment is a modification of the first embodiment. In the fourth embodiment, a plurality of sets of the bars-in-bars marks according to the first embodiment are formed with various pattern widths.

The bars-in-bars marks of the mask pattern used in the present embodiment, as shown in FIG. 11, are common to those of the first embodiment in that they comprise small patterns and large patterns. Unlike the first embodiment, birds-in-birds marks composed of small patterns of different pattern widths and large patterns of different pattern widths are disposed.

Specifically, the aberration measuring mask comprise four bars-in-bars marks 91 to 94 each having a pattern line length direction set at 0° with respect to a reference line 90, four birds-in-birds marks 95 to 98 each having a pattern line length direction set at 30° with respect to the reference line 90, and four bars-in-bars marks 99 to 102 each having a pattern line length direction set at 60° with respect to the reference line 90. Each of the bars-in-bars marks 91, 95 and 99 comprises small patterns 101 each having a pattern width of 1 µm and large patterns 102 each having a pattern width of 1.2 µm. Each of the bars-in-bars marks 92, 96 and 100 comprises small patterns 103 each having a pattern width of 0.5 µm and large patterns 104 each having a pattern width of 0.6 µm. Each of the bars-in-bars marks 93, 97 and 101 comprises small patterns 105 each having a pattern width of 0.25 µm and large patterns 106 each having a pattern width of 0.3 µm. Each of the bars-in-bars marks 94, 98 and 102 comprises small patterns 107 each having a pattern width of 0.15 µm and large patterns 108 each having a pattern width of 0.18 µm.

The advantages of performing the aberration measurement using the bars-in-bars marks having a plurality of pattern widths will be explained with reference to FIG. 12.

Figure 12:
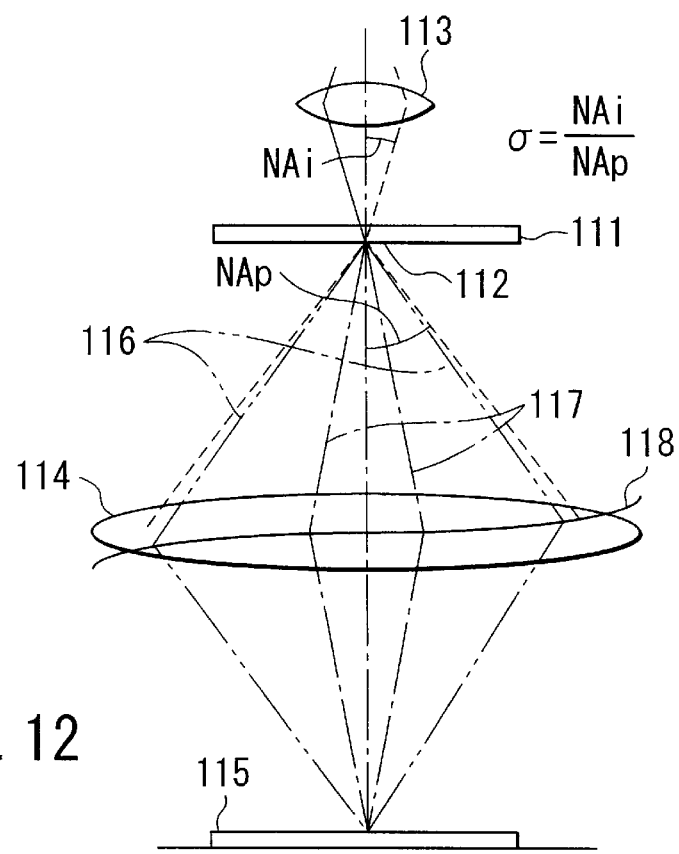
FIG. 12 is a view for explaining advantages of aberration measurement using patterns of different pattern widths.

FIG. 12 is a conceptual view of an exposure device for transferring a pattern on a photomask onto a wafer. Patterns 112 on a photomask 111 are illuminated by an illumination optical system 113, and the patterns 112 are focused on a substrate 115 via a projecting optical system 114. In this case, a coherence factor σ is expressed as a ratio between a numerical aperture $NA_p$ of the projecting optical system 114 and a numerical aperture $NA_I$ of the illumination optical system 113.

Light incident on the patterns 112 on the photomask 111 is diffracted at an angle inversely proportional to a size or a pitch of the patterns 112. Accordingly, where the size or pitch is small, the light travels along an optical path 116 indicated by a two-dot-and-dash line. Where the size or pitch is large, the light travels along an optical path 117 indicated by a dot-and-dash line. Where an aberration function 118 of the projecting optical system 114 is expressed by a curve, as shown in FIG. 12, in relation to a radial direction of the lens, the optical path 116 runs in a region where the inclination of the aberration function 118 is large and the optical path 117 runs in a region where the inclination of the aberration function 118 is small.

Accordingly, when the three-fold symmetry aberration or five-fold symmetry aberration is measured using the patterns with different pattern widths, various optical paths are defined in accordance with the pattern widths. Thus, a great deal of aberration information can be acquired in the radial direction of the pupil surface.

According to the present embodiment, a great deal of aberration information can be acquired in the radial direction of the pupil surface by measuring aberration using the photomask comprising a plurality of bars-in-bars marks with different pattern widths.

The present invention is not limited to the above-described embodiments.

In the embodiments, the aberration of the reduction-projecting exposure device as shown in FIG. 4 is measured. Needless to say, the invention is not limited to this structure. Aberration of other kinds of optical systems may be measured. For example, aberration measurement can be performed in any type of optical system in which aberration may occur, such as an optical system in an alignment sensor or a misalignment inspection device.

The relative positional displacement of transfer patterns can be measured by using not only the optical misalignment length measuring device, but also an electron beam length measuring device (SEM), etc.

In the embodiments, the three-fold symmetry aberration and five-fold symmetry aberration are measured. Needless to say, if a photomask having patterns arranged at the same angle in the (2n+1) direction is used, higher-order (2n+1)-fold symmetry aberrations can be measured.

The bars-in-bars marks or pattern units may not be provided on a single photomask, but they may be provided on different photomasks.

In the embodiments, a plurality of patterns having different pattern widths in one direction are disposed and a relative positional displacement of these patterns is measured to measure aberration. However, this invention is applicable to the line-width abnormality value measuring method wherein a plurality of patterns having the same line-width are disposed and an error in line width at endmost patterns is measured to measure aberration in the line-width direction.

It is confirmed that the present invention includes the following inventive concept: an aberration measuring mask comprising a plurality of aberration measuring pattern units each having a plurality of elemental patterns arranged in a direction of a given straight line, the aberration measuring pattern units being disposed in a given circumferential direction such that said straight line of each of the aberration measuring pattern units is cyclically shifted relative to a reference line at an angle of $(\pi/2)/(2n+1)$ rad (n=natural number) in a range between 0 rad and $\pi/2$ rad.

As has been described above in detail, according to the present invention, there is provided an aberration measuring mask comprising a plurality of aberration measuring pattern units each having a plurality of elemental patterns arranged in-a direction of a given straight line, the aberration measuring pattern units being disposed in a given circumferential direction such that said straight line of each of the aberration measuring pattern units is cyclically shifted at an angle of $\pi/(2n+1)$rad (n=natural number) in a range between 0rad and $\pi$rad. Using this aberration measuring mask, third- or more-order aberrations, other than in the axial direction, which could not measured in the prior art, can be measured.

Additional advantages and modifications will readily occur to those skilled-in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An aberration measuring method comprising the steps of:

providing an aberration mask comprising a plurality of aberration measuring patterns units each having a plurality of elemental patterns with a predetermined pattern width, the elemental patterns having a pattern length direction parallel to a given straight line, the aberration measuring pattern units being disposed in a given circumferential direction such that said straight line of each of the aberration measuring pattern units is cyclically shifted relative to a reference line at an angle of $(\pi/2)/(2n+1)$ rad (n=natural number) in a range between 0 rad and $\pi/2$ rad;

transferring pattern images of the aberration measuring mask onto a substrate to be processed, using an optical system; and detecting the transferred pattern image, thereby measuring an aberration in the direction of said reference straight line of the optical system.

2. A method according to claim 1, wherein the elemental patterns included in each of the aberration measuring pattern unit have the pattern length direction in the same direction and include at least two patterns with different pattern widths, wherein the aberration is measured on the basis of a relative positional displacement of the transferred patterns due to the difference in pattern width.

3. A method according to claim 1, wherein the elemental patterns included in each of the aberration measuring pattern unit comprise first patterns and second patterns, the first and second patterns being arranged at right angles with each other and formed on the aberration measuring mask.

4. A method according to claim 1, wherein said aberration measuring mask comprises a plurality of aberration measuring pattern units with different pattern widths.

5. An aberration measuring system comprising:
   an illumination optical system;
   an aberration measuring mask disposed on an optical path of light from the illumination optical system and comprising a plurality of aberration measuring pattern units each having a plurality of elemental patterns arranged in a direction of a given straight line, the aberration measuring pattern units being disposed in a given circumferential direction such that said straight line of each of the aberration measuring pattern units is cyclically shifted relative to a reference line at an angle of $(\pi/2)/(2n+1)$ rad (n=natural number) in a range between 0 rad and $\pi/2$ rad; and
   a projecting optical system for focusing light which has passed through the aberration measuring mask, onto a substrate to be processed.

6. A system according to claim 5, wherein the elemental patterns included in each of the aberration measuring pattern unit have the pattern length direction in the same direction and include at least two patterns with different pattern widths.

7. A system according to claim 5, wherein the elemental patterns included in each of the aberration measuring pattern unit comprise first patterns and second patterns, the first and second patterns being arranged at right angles with each other and formed on the aberration measuring mask.

8. A system according to claim 5, wherein said aberration measuring mask comprises a plurality of aberration measuring pattern units with different pattern widths.

9. An aberration measuring mask comprising a plurality of aberration measuring pattern units each having a plurality of elemental patterns arranged in a direction of a given straight line, the aberration measuring pattern units being disposed in a given circumferential direction such that said straight line of each of the aberration measuring pattern units is cyclically shifted relative to a reference line at an angle of $(\pi/2)/(2n+1)$ rad (n=natural number) in a range between 0 rad and $\pi/2$ rad.

10. An aberration measuring mask according to claim 9, wherein the elemental patterns included in each of the aberration measuring pattern unit have the pattern length direction in the same direction and include at least two patterns with different pattern widths.

11. An aberration measuring mask according to claim 9, wherein the elemental patterns included in each of the aberration measuring pattern unit comprise first patterns and second patterns, the first and second patterns being arranged at right angles with each other and formed on the aberration measuring mask.

12. An aberration measuring mask according to claim 9, wherein said aberration measuring mask comprises a plurality of aberration measuring pattern units with different pattern widths.

* * * * *

UNITED STATES PATENT AND TRADEMARK OFFICE
CERTIFICATE OF CORRECTION

PATENT NO. : 6,437,858 B1
DATED : August 20, 2002
INVENTOR(S) : Kouno et al.

It is certified that error appears in the above-identified patent and that said Letters Patent is hereby corrected as shown below:

<u>Title page,</u>
Item [74], "*Attorney,*" "Dunner,.L.L.P." should read -- Dunner, L.L.P. --.

<u>Column 10,</u>
Line 52, "patterns units" should read -- pattern units --.

<u>Column 11,</u>
Lines 3, 10 and 33, "unit" should read -- units --.

<u>Column 12,</u>
Line 3, "unit" should read -- units --.
Lines 20 and 25, "pattern unit" should read -- pattern units --.

Signed and Sealed this

Eighteenth Day of March, 2003

JAMES E. ROGAN
*Director of the United States Patent and Trademark Office*